United States Patent [19]
Deutsch et al.

[11] Patent Number: 5,471,090
[45] Date of Patent: Nov. 28, 1995

[54] ELECTRONIC STRUCTURES HAVING A JOINING GEOMETRY PROVIDING REDUCED CAPACITIVE LOADING

[75] Inventors: Alina Deutsch, Chappaqua; David A. Lewis, Carmel; Chandrasekhar Narayan, Hopewell Junction; Anthony L. Plachy, Hyde Park, all of N.Y.

[73] Assignee: International Business Machines Corporation, Armonk, N.Y.

[21] Appl. No.: 28,023

[22] Filed: Mar. 8, 1993

[51] Int. Cl.⁶ .............................. H01L 23/48; H01L 29/44
[52] U.S. Cl. .......................... 257/734; 257/777; 257/779; 257/786
[58] Field of Search ........................ 257/734, 738, 257/777, 778, 779, 784, 785, 786, 758

[56] References Cited

U.S. PATENT DOCUMENTS

| | | | |
|---|---|---|---|
| 3,289,046 | 11/1966 | Carr | 257/778 |
| 3,403,438 | 10/1968 | Best et al. | 257/778 |
| 3,561,107 | 2/1971 | Best et al. | 257/778 |
| 3,716,907 | 2/1973 | Anderson | 257/778 |
| 3,871,014 | 3/1975 | King et al. | 257/778 |
| 3,871,015 | 3/1975 | Lin et al. | 257/778 |
| 3,967,296 | 6/1976 | Intrator . | |
| 4,864,079 | 9/1989 | Barlow . | |

FOREIGN PATENT DOCUMENTS

| | | |
|---|---|---|
| 0516402A1 | 12/1992 | European Pat. Off. . |
| 1919567 | 4/1969 | Germany . |
| WO80/01220 | 6/1980 | WIPO . |

OTHER PUBLICATIONS

IBM Technical Disclosure Bulletin, vol. 33, No. 4, pp. 128–130, Sep. 1990.
K. Hinrichsmeyer, et al. "Shaped Strip Lead Interconnections With Lead Tin Rivets And Chip Carriers With Notches", IBM Tech. Discl. Bull. vol. 32, No. 10A, Mar., 1990 pp. 163–164.

J. P. Hoekstra, "Mini–Structure Joining Technique" IBM Tech. Discl. Bull. vol. 23, No. 7B Dec., 1980, p. 3410–1.

R. M. Mureko, "Pinless Module Connector", IBM Tech. Discl. Bull. vol. 27, No. 4B, Sep., 1984, p. 2345–2346.

*Primary Examiner*—Sara W. Crane
*Assistant Examiner*—Carl Whitehead, Jr.
*Attorney, Agent, or Firm*—Daniel P. Morris

[57] ABSTRACT

Electrical interconnection structures are described. The electrical interconnection structures are formed by electrically interconnecting in a stack a plurality of discrete substrates. By using a plurality of discrete substrates, a multilayer dielectric/electrical conductor structure can be fabricated from individual discrete substrates each of which can be tested prior to forming a composite stack so that defects in each discrete substrate can be eliminated before inclusion into the stack. Electrical interconnection between adjacent substrate is provided by an array of contact locations on each surface of the adjacent substrates. Corresponding contacts on adjacent substrates are adapted for mutual electrical engagement. Adjacent contact locations can be thermocompression bonded. To reduce the parasitic capacitance and coupled noise between the contact pads and the electrical conductors within the interior of each discrete substrate, the contact pads on each substrate have elongated shape. The elongated contact pads or lattice pads on adjacent substrates are nonparallel and preferably orthogonal so that the corresponding pads of adjacent substrates electrically interconnect an intersecting area which varies in location along the elongated contact pads as the placement of the adjacent substrates varies in the manufacture.

24 Claims, 6 Drawing Sheets

ELECTRONIC STRUCTURES HAVING A JOINING GEOMETRY PROVIDING REDUCED CAPACITIVE LOADING

FIELD OF THE INVENTION

The present invention is directed to electronic structures having electrically interconnected contact locations providing reduced capacitive loading between the contact locations and electrical conductors within the electronic structure.

BACKGROUND OF THE INVENTION

The computer electronics industry uses electronic packaging substrates on which electrical devices, such as semiconductor chips, are electrically mounted. The trend in the electronics industry is to use multilevel thin film structures on the electronic devices and substrates for providing electrical interconnection to the circuits on the chips and the substrates. State of the art multilevel thin film structures are preferably formed from thin layers of polymeric material with electrical conductors disposed therebetween and electrical conducting vias disposed through the thin film polymeric layers to provide electrical interconnection of the conductors on different levels of the multilevel structure.

In order to reduce fabrication time and hence the cost of these thin film structures a parallel fabrication process rather than a sequential process is preferred In a sequential process, an electronic substrate, such as, a semiconductor chip or packaging substrate is provided. A polymer layer is disposed on a surface of the substrate. On the exposed surface of the polymer layer a patterned layer of electrical conductors is disposed. Another layer of polymeric material is disposed on the electrically conducting layer. Electrically conducting vias are formed through the second polymeric layer. A second layer of patterned electrical conductors are disposed on the exposed surface of the second polymeric layer. This process is continued until the desired number of layers of electrical conductors with polymeric layers disposed therebetween having electrically conducting vias to electrically interconnect adjacent electrically conducting layers is formed. In this sequential process, any one of the polymeric layers or the electrically conducting layers or the electrically conducting vias can have a defect which renders the finally formed structure is unusable.

It is preferable to build the multilayer structure in a parallel process wherein a group of planar subassemblies are fabricated and tested and then electrically assembled to form the multilevel thin film structure. The subassemblies have on both surfaces thereof an array of contact pads which are typically circular or square. A first substrate is disposed in contact with a second substrate so that an array of contact locations on the first substrate is aligned with an array of contact locations on the second substrate with corresponding contact locations joined in electrical contact.

The center of the first substrate is aligned to the center of the second substrate to within a manufacturing tolerance. This manufacturing tolerance results in a statistical distribution of the overlap of the contact location on the first substrate with corresponding contact locations on the second substrate. Additionally, due to stress in the substrate or shrinkage during formation of the substrate, there may be some distortion in the contact locations. If the contact locations are circular or square, they must have a minimum size dictated by the tolerance of the alignment of the first and second substrates and the distortion. There is a capacitance between this contact location and the electrical conductors in the substrate above and beneath the contact pad. This is a parasitic capacitance which causes delays in signals propagated through the multilevel structure. To reduce this parasitic capacitance the dielectric layer between the contact pad and the electrical conductors beneath the pad must have an increased thickness. This thickness adds to the manufacturing cost by requiring additional material, a different processing step than used to fabricate the other dielectric layers, additional defects due to the thickness and additional stress in the composite structure.

SUMMARY OF THE INVENTION

It is an object of the present invention to provide an improved electronic structure having joining geometries providing minimal parasitic capacitance.

It is an additional object of the present invention to provide improved packaging structures formed from subassemblies.

It is another object of the present invention to provide a multilevel electrical conductor/dielectric structure formed in a parallel process wherein contact locations electrically interconnecting subassemblies have minimal parasitic capacitance.

It is yet another object of the present invention to provide an electronic structure comprised of subassemblies which are each individually testable and are electrically joined by intersecting electrical contact pads which provide minimal parasitic capacitance.

It is a further object of the present invention to provide a joining structure providing minimal capacitance without compromising joining yield.

A broad aspect of the present invention is an electronic structure formed from a first substrate and a second substrate. Each substrate has a side having a plurality of elongated electrical conductors disposed thereon. The sides, having electrical conductors disposed thereon, are disposed facing each other and are aligned so that the electrical conductors on the first substrate are disposed in electrical contact with corresponding electrical conductors on the second substrate. The corresponding elongated conductors intersect in an overlapping area. The corresponding elongated electrical conductors are not parallel.

In a more specific aspect of the present invention the corresponding elongated electrical conductors intersect in an area which is substantially constant over the variation of the alignment of the adjacent substrates within the manufacturing tolerance.

In another more specific aspect of the present invention, the electrical conductors on the first and second substrate are elongated rectangles.

In another more particular aspect of the present invention, the electrical conductors of the first substrate are annular in shape and the electrical conductors on the second substrate are elongated in shape.

In another more particular aspect of the present invention, a stack of substrates is formed and adjacent substrates are electrically interconnected by corresponding electrical conductors in electrical contact.

In another more particular aspect of the present invention, each substrate is formed from a pair of signal planes having orthogonally disposed electrical conductors which are disposed between voltage planes.

BRIEF DESCRIPTION OF THE DRAWINGS

These and other objects, features and advantages of the present invention will become apparent upon a consideration of the following detailed description of the invention when read in conjunction with the figures, in which.

DETAILED DESCRIPTION

As a greater proportion of the chip-to-chip interconnections for high performance computing systems (including new high performance workstations) is built into thin film structures with polymeric dielectric layers rather than ceramic or PC boards, the build cycle time becomes a major cost factor. As the number of plane pairs of thin film wiring increase, the build cycle time will also increase, seriously impacting the cost and yield.

To overcome these problems, a method of parallel build has been described in U.S. patent application Ser. No. 07/695,368 filed on May 3, 1991 to Arjavalingam et al. which is assigned to the assignee of the present invention, the teaching of which is incorporated herein by reference. Each plane pair is produced and then joined to a substrate with subsequent plane pairs joined similarly. In this strategy, the inter-plane pair joining is accomplished by providing an additional layer for the joining pads, between the ground planes of two plane pairs.

Preferably the joining uses a gold-gold thermal compression bond, although it is not necessarily restricted to the joining process. The advantage of this geometry is that there is a very high probability of a successful join (meaning complete capture of all pads—electrically good) with modest amounts of distortion or misalignment. The disadvantage is that when large pads are used a thicker dielectric layer is required to minimize the capacitance set up between the ground planes and the joining pads. Capacitive loading affects signal path delay in proportion to $C Z_0/2$ and introduces unwanted signal distortion with amplitude proportional to $C Z_0 Vin/2 tr$ where $Z_0$ is the characteristic impedance and tr is the rise time of the source with voltage swing Vin. All of these effects impact the overall system performance. By reducing the area of these pads, the dielectric layer between the joining pads and the ground planes can be reduced to a "standard" thickness, thereby minimizing manufacturing cost and rework and process steps, while maintaining a factor of greater than three reduction in the capacitance.

Figure 1:
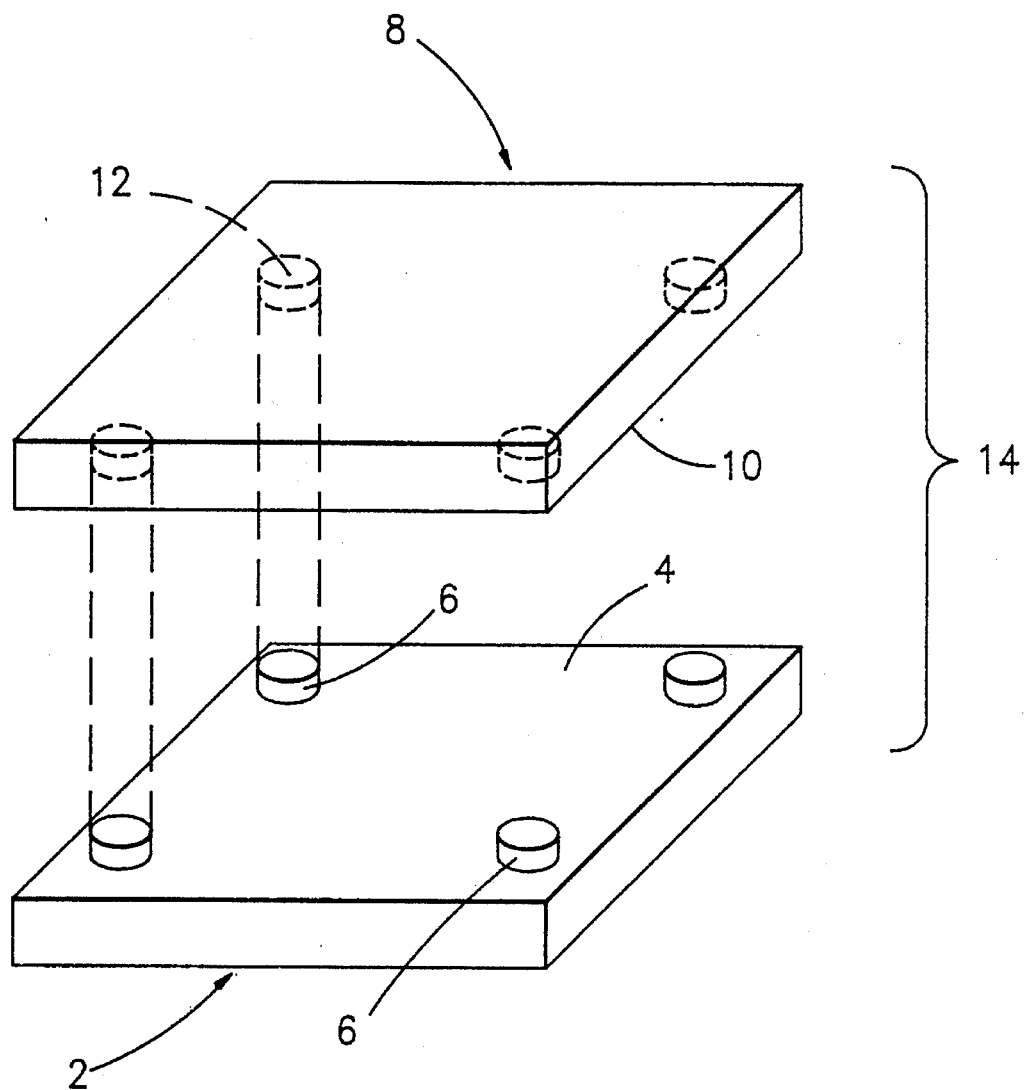
FIG. 1 shows a perspective disassembled view of an electronic structure composed of two substrates wherein cylindrical contact pads on both substrates are used to electrically interconnect both substrates.

Referring now to FIG. 1, substrate 2 has disposed on surface 4 a plurality of cylindrical shaped contact pads 6. Substrate 8 has a surface 10 having disposed thereon a plurality of cylindrical shaped contact pads 12. FIG. 1 shows a perspective view with surface 10 of substrate 8 disposed facing surface 4 of substrate 2. Contact pads 12 on surface 10 of substrate 8 are shown in phantom since they are on the side of substrate 8 which is not visible in the perspective view of FIG. 1. Substrate 2 and substrate 8 are multilevel wiring substrate which can be individually tested for electrical opens and shorts. The array of contact pads 12 on substrate 8 correspond to the array of contact pads 6 on substrate 2. The array of contact pads 12 is disposed in physical and in electrical contact with the array of contact pads 6 to form an electrical interconnection of substrate 2 and substrate 8. The combination of substrate 2 and substrate 8 forms a structure 14. Contact pads 12 and 6 can be electrically interconnected by any commonly known means, such as solder or the pads can be gold coated and pressed together by pressing substrate 8 towards substrate 2 using commonly used means to join, such as thermocompression bonding and transient liquid phase attach.

Figure 2:
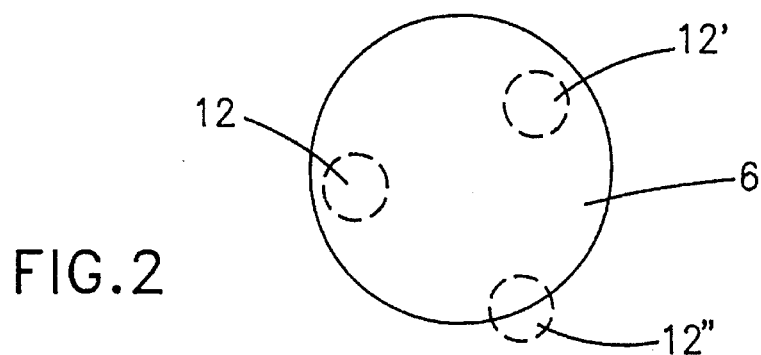
FIG. 2 shows a schematic top view of the contact location on the first substrate disposed on the contact location of the second substrate showing misalignment therebetween.

In the manufacture of substrate 14 of FIG. 1 substrate 8 cannot be placed in perfect alignment with respect to substrate 2. There is a statistical distribution of the placement of substrate 8 with respect to substrate 2 around the perfectly aligned position. Therefore, contact pad 6 statistically will not be perfectly aligned with corresponding contact pad 12 on substrate 8. FIG. 2 shows a top view of the alignment of contact pad 6 to a corresponding contact pad 12. In FIG. 2, contact pad 12 is shown as circle in three positions, as 12, 12' and 12", relative to contact pads 6 due to the misalignment of substrates 2 and 8. Because of this misalignment, a circular or square contact pad is generally used for contact pads 6 and 12 to insure electrical contact between pads 6 and 12. A square or circle has a relatively large area forming a parasitic capacitance with metal conductors underlying the contact pad in each substrate 2 and 8. Since capacitance is directly proportional to area and inversely proportional to the separation between the two plates (i.e., the pad and underlying conductor) forming the capacitance, this parasitic capacitance can be reduced by increasing the thickness of the dielectric layer between the contact pad and the underlying electrical conductors. As noted herein above, increasing the dielectric thickness creates problems and increases the manufacturing cost of the structure and cannot be done without an excessive number of additional process steps, each acting to reduce yield.

Figure 3:
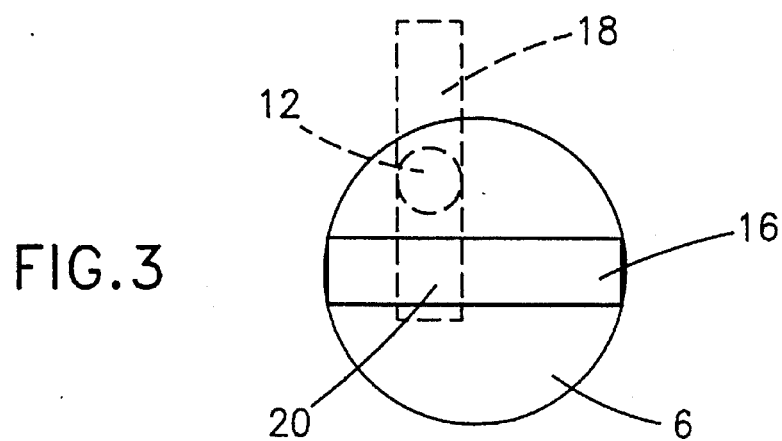
FIG. 3 shows a view similar to FIG. 2 with elongated rectangular contact locations inscribed within the circular contact locations of FIG. 2 as alternate contact locations according to the present invention.

Increasing the thickness of the dielectric layer between the adjacent parallel plates can be avoided by using elongated contacts as shown schematically in FIG. 3. Instead of using circular contacts 6 and 12, elongated rectangular contacts 16 and 18, corresponding to contact 6 and 12 respectfully, can be used As shown in FIG. 3, the elongated rectangular contact 16 is inscribed within the circular contact 6 and the circle 12 is inscribed within elongated contact 18. When substrates 2 and 8, as shown in FIG. 1, are misaligned as indicated by FIG. 3, the two contacts 6 and 18 will have an overlap region 20 within which contact 6 and 18 are in electrical contact.

For example, if the dimensions of the two elongated contact are 15 µm wide and quite thin ($\approx$2 µm)—of similar size to the vias to be connected and the lines in the thin film structure—and 150 µm long—the same size as the diameter of the largest pad in the conventional geometry, the maximum distortion/misalignment which can be accounted for is 95 µm along the diagonal and 75 µm in the x-y direction with complete overlap of the connectors, compared with 50 µm for the conventional geometry.

Capacitive loading is related to the size of the pads by the relationship $$C = \frac{\epsilon A}{d}$$

where $\epsilon$ is the dielectric constant, A is the area of the pads and d is the thickness of the dielectric and hence the capacitance will be reduced as the pad size is reduced. By using the dimensions described above, the size of the pads is reduced by a factor of four (4) from 17671 µm$^2$ (assuming complete capture of the 50 µm diameter circular pad) to 4275 µm$^2$. If only partial capture of the pads is allowed, this difference becomes even greater (as the area for the circular pads increases at a significantly greater rate than for the lines).

Figure 4:
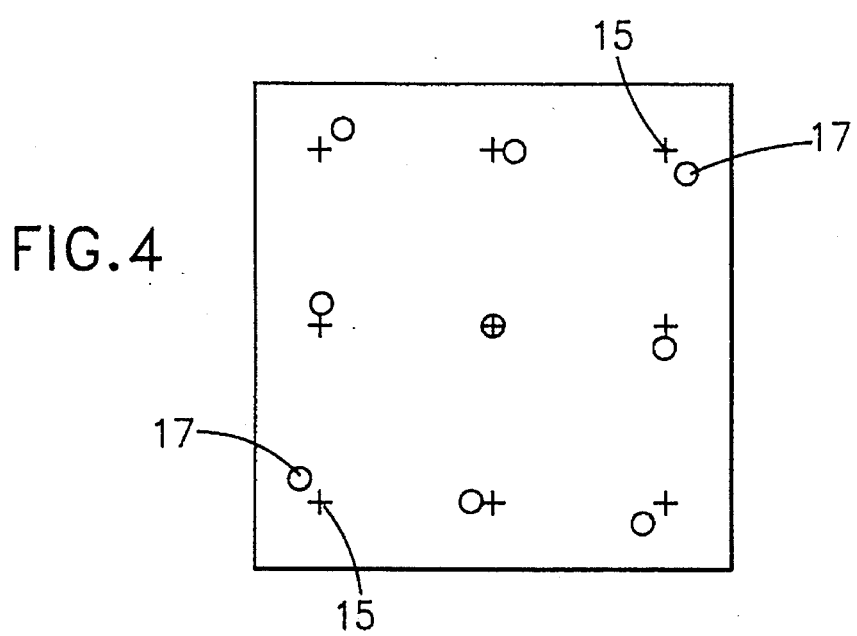
FIG. 4 schematically shows distortion of a substrate altering the location of contact pads from the design positions.

These joining pads must be manufactured to be considerably larger than the vias they attach too, because they must account for misalignment and distortion of the substrates 2 and 8 in FIG. 1. Misalignment arises from the accuracy of the alignment process and is observed as a displacement of the center of the two parts. Additionally, there can be a rotational misalignment, in which the corners of one substrate are rotated compared with the other substrate. Usually, these effects can be maintained to within very narrow tolerances, with the correct tooling and procedure. Distortion can arise due to stress in one substrate. This is often observed when one substrate consists of a thin film, containing electrical wiring and is mounted on a frame under tension. The frame can be a ceramic, glass ceramic metal, glass substrate and the like. In such a case, distortion occurs radially away from the center of the substrate and is maximum along the diagonals of a square part. This can be seen in FIG. 4, in which the original or design position is marked with crosses 15 and the actual position is marked by circles 17. Distortion can also arise from the sintering of ceramic materials, which results in non-uniform shrinkage.

To maximize the size of the pads and minimize the probability of pads on substrate 2 from touching and shorting to signal lines to a pad on substrate 4 apart from the corresponding pad, the pads on substrate 4 are much reduced in size compared with those on substrate 2.

If the length of the lines are adjusted to normalize the maximum distortion for the circular and line geometries along the diagonal, where the greatest distortion is observed, the length of the lines can be reduced to 87 µm while maintaining the same tolerance capability of the circular pads. This further reduces the cross-sectional area to 2385 µm$^2$, corresponding to a reduction in the cross-sectional area of over seven fold compared with circular pads.

Using a process, in which the interplane joining is sandwiched between two power/ground planes as the model, one other benefit is to reduce the thickness of this region to match standard dielectric layers. If a circular pad is used of 50 µm diameter the dielectric layer is about 12.5 µm between the ground plane and the join pad. This may present problems during manufacture in which the polyimide must be applied using multiple coats resulting in reduced yield and longer manufacturing times. By trading off some of the reduced capacitance obtained by using the line on line approach, this dielectric layer can be made 6 µm, the same as the dielectric layers. If this new configuration is utilized, the capacitance would be reduced by a factor of 3.5 from 0.044 pF to 0.013 pF, compared with the pad on pad geometry.

Thin joining lines, especially if a Cu/Au bonding structure is to be used, result in the higher resistance joins. In applications, in which power via currents may reach a maximum of 200 mA, either a combination structure can be used, e.g., the line on line geometry for the signal wires (which are nominally more resistive) and pad on pad for the power/ground connections since capacitance is not a performance limiting factors all line on line connections, could be utilized, using a thicker bond line for the power and in this case; or ground connections.

Figure 5:
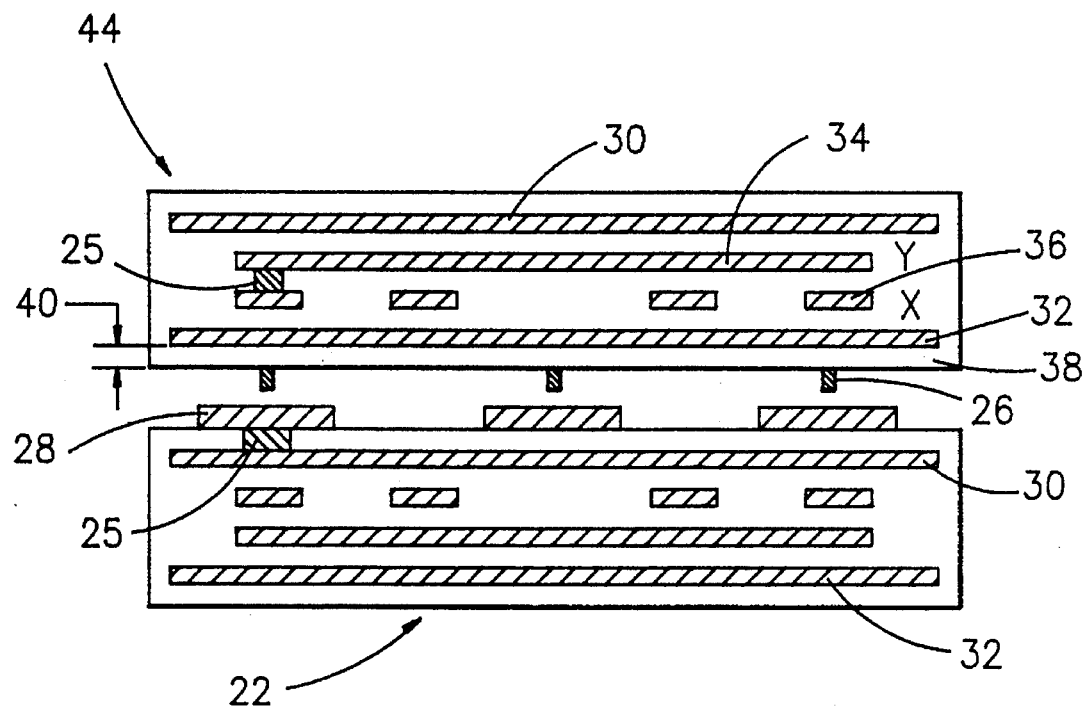
FIG. 5 is a cross-sectional view of a structure according to the present invention having two subassemblies which are electrically interconnected by orthogonal elongated rectangular contact pads.

FIG. 5 shows a cross-sectional view of a structure similar to that of FIG. 1 having the elongated rectangular contact pads as shown in FIG. 3. In FIG. 5, substrate 22 is electrically joined to substrate 24 through elongated rectangular contact pads 26 on substrate 24 and elongated rectangular contact pads 28 on substrate 22. Contact pads 28 and 26 are shown to be orthogonal. It is not necessary that contact pads 26 and 28 of FIG. 5 or contact pads 16 and 18 of FIG. 3 be orthogonal. It is preferably that pads 16 and 18 are not parallel. Each substrate 22 and 24 has a first and second ground or voltage plane 30 and 32, respectively. Between the ground and voltage planes there is, preferably signal layer 34 in a y direction and single layer 36 in an x direction as commonly practiced in the art.

Each substrate 22 and 24 can have a plurality of assemblies of ground planes with signal planes disposed therebetween. The dielectric material between the ground plane and the signal planes is preferably a polymer, such as a polyimide. The electrical conductors are preferably copper. Contact pads 26 are spaced apart from the underlying conducting plane 32 by a dielectric material layer 38 having a thickness 40. When a circular or square contact pad is used, the thickness 40 must be significantly greater than when an elongated rectangular contact pad such as 16 and 18 of FIG. 3 is used in order to keep the parasitic capacitance at a minimum. FIG. 5 shows two substrates 22 and 24 electrically interconnected, however, any number of substrates of the type of 22 and 24 can be disposed in a stack.

Figure 6:
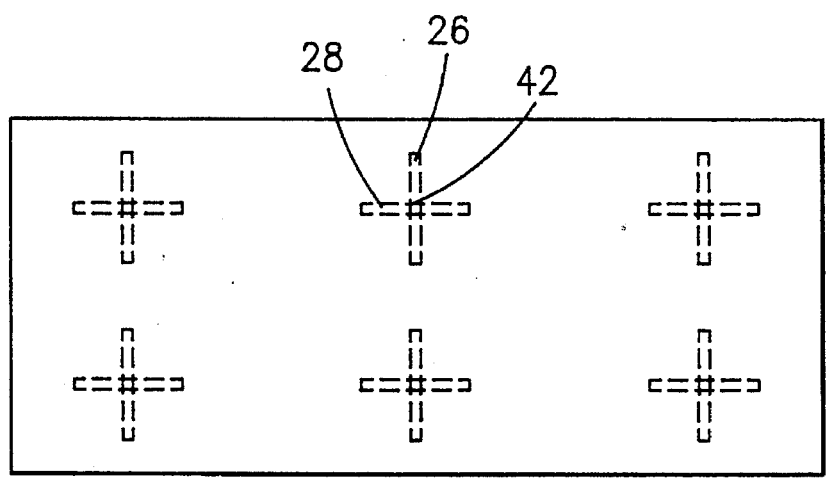
FIG. 6 is a top view of the contact locations of the structure of FIG. 5 showing the orthogonal array of contact locations of the first and second substrate.

FIG. 6 shows a top view of the array of elongated conductors 28 and 26 having electrical interconnection at overlapping region 42.

Figure 7:
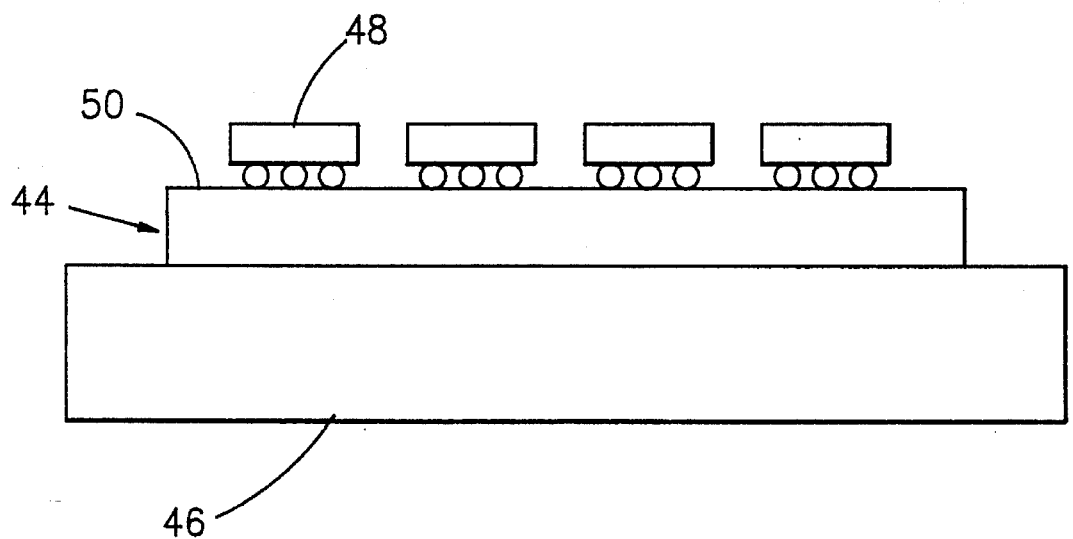
FIG. 7 shows the structure of the present invention mounted onto a substrate for electrically interconnecting electronic devices to the substrate.

FIG. 7 shows the structure 44 of FIG. 5 disposed on a substrate 46. There are a plurality of semiconductor chips 48 mounted onto surface 50 of structure 44. Structure 44 provides electrical interconnection between the semiconductor chips and between semiconductor chips 48 and electrical circuits within substrate 46.

The various metallization layers 30, 32, 34 and 36 of the substrates 22 and 24 of FIG. 5 are electrically interconnected by electrically conducting vias 25 as is a common practice within the art. Electrically conducting vias also electrically interconnect the conductors 30, 32, 34 and 36 to the contact pads 26 and 28.

Figure 8:
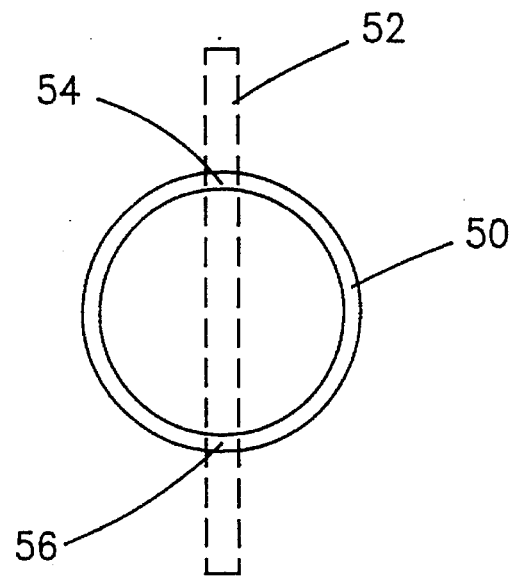
FIG. 8 shows the electrical interconnection of a rectangular elongated contact and a circular annular contact.
Figure 9:
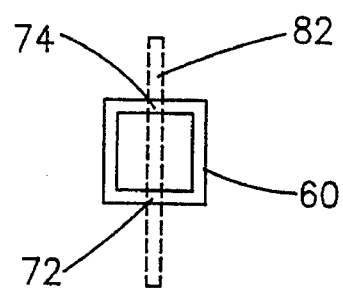
FIG. 9 shows the electrical interconnection of a rectangular elongated contact and a polygonal annular contact.
Figure 10:
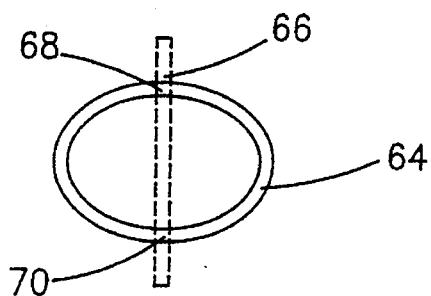
FIG. 10 shows the electrical interconnection of a rectangular elongated contact and an elipsoidal annular contact.

FIGS. 8, 9 and 10 show alternate embodiments of the intersecting elongated rectangles 16 and 18 of FIG. 3. FIG. 8 shows one contact pad on one of the substrates 22 and 24 of FIG. 5 having a circular annular shape 50. The contact location on the other of the substrate 22 and 24 is an elongated rectangle 52. The electrical interconnection area is a combination of regions 54 and 56. FIG. 9 shows one of the contact locations being a polygonal annular shape 60, in particular, a square annular shape and the other contact location being an elongated rectangle 62. FIG. 10 shows one of the contact locations being an elipsoidal annular pad 64 and the other contact location being an elongated rectangle 66 wherein the electrical interconnection area is a combination of regions 68 and 70. The elongated conductors are preferably rectangles but can be oval in shape or elepsoidal in shape. For the purpose of this application the annular contact of FIGS. 7, 8 and 9 are elongated contacts since they are elongated in the regions of intersections 54, 56, 68, 70 72 and 74.

Figure 11:
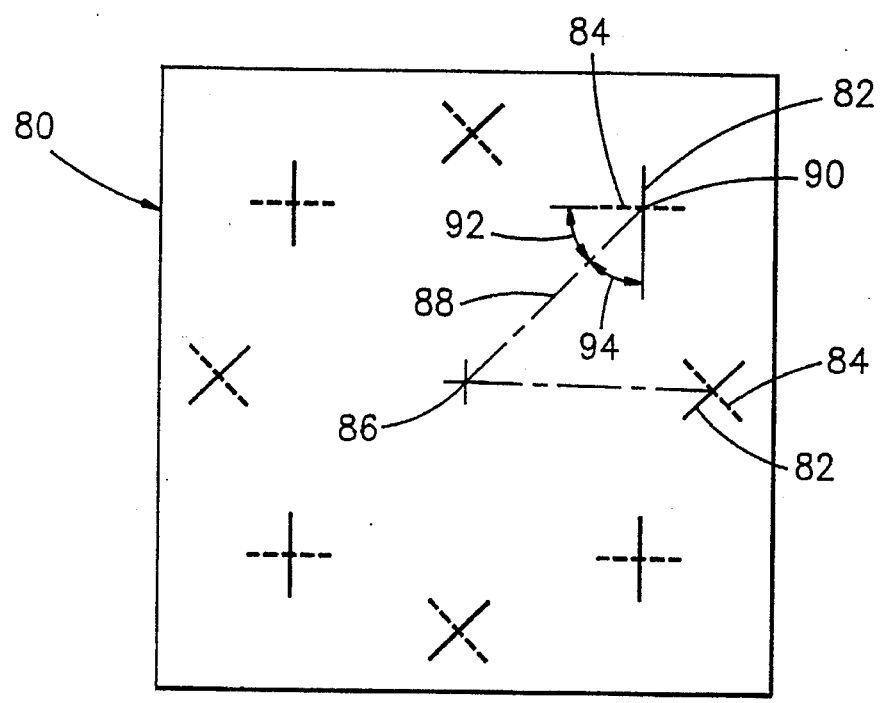
FIG. 11 shows the line-on-line interconnection oriented radially from the center of the substrate.

An alternate form of this strategy is to orient the lines such that the diagonal of the line on line configuration is oriented toward the center of the film—the 0 distortion point as shown in FIG. 11. This geometry allows a 40% increase in distortion capability for joins at the center of edges over the method described above. This improvement decreases towards the corners when it becomes the same as that described above. This arrangement would provide the additional distortion capabilities to correct for rotational distortion (or rotational misalignment) and for de-bonding between the frame and the film. FIG. 11 shows a view similar to that of FIG. 4. FIG. 11 shows substrate 90 having elongated contact locations 82 disposed thereon. Elongated contact locations 82 are shown as solid lines. Another substrate (not shown) is disposed thereover with elongated contact locations 84 disposed thereon. Elongated contact locations 84 are shown in dashed lines. Substrate 82 and the substrate not shown form a structure such as shown in FIG. 5. Pads 82 and 84 intersect in an area to form an electrical contact. To capture maximum distortion and therefore maximize yield, as described above, each pad 82 and each pad 84 does not have the same orientation. Each pad 82 and its corresponding pad 84 are not parallel and are preferably orthogonal. Each pad 82 and its corresponding pad 84 are not aligned so that the long axis of each elongated pad 82 and 84 are not parallel with a line 88 from a central location 86 of substrate 82 and the area of intersection 90 of elongated pads 82 and 84. Central location 86 is preferably the center of substrate 80. Line 88 forms angle 92 with pad 84 and angle 94 with pad 94. Preferably, angle 92 is equal to angle 94.

Figure 12:
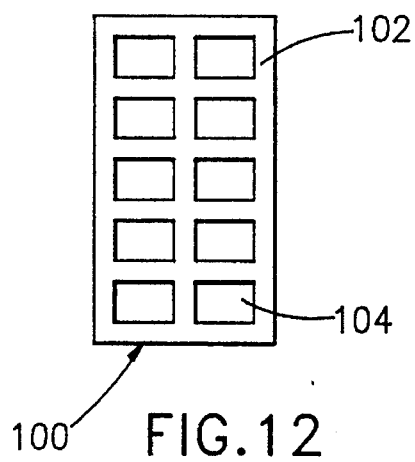
FIGS. 12, 13 and 14 show alternate embodiments of contact pads having low capacitance.
Figure 14:
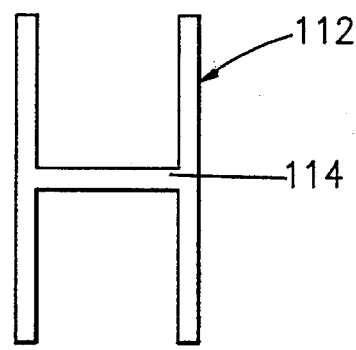
Figure 13:
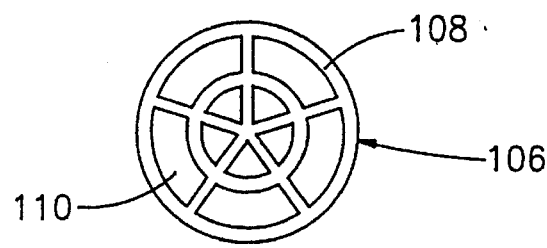

FIGS. 12, 13 and 14 show alternate embodiments of elongated or reduced area contact pads which have decreased capacitance because of decreased area. FIG. 12 shows a polygonal lattice or mesh. The contact pad 100 is made of electrically conducting material 102 have regions 104 which are missing. FIG. 13 shows a similar structure to that of FIG. 12. In FIG. 13, pad 106 is made of electrically conducting material 108 having missing region 110 with arc sections of a circle. FIG. 14 shows another embodiment of an elongated or reduced contact area pad 112 made of electrically conducting material 114 in the shape of a capital II.

An enhanced joining pattern can be obtained where one "pad" is a square mesh as shown in FIG. 12. The corresponding pad on the adjacent substrate can be an elongated rectangle or mesh. Such a structure has a number of benefits, but increases the capacitive loading compared with the line on line geometry. Some of the benefits of this enhancement include 1. the ability to use a shorter line on the second joining surface.
2. a greater number of contact joins per line, which will increase yield in case of (a) contamination or (b) the line was incompletely formed.
3. Increase the capture area for the geometry (this could be easily made to account for double distortion) which might allow thinner pads to be used and still accommodate higher current densities.
4. the capacitance can be reduced while maintaining the same distortion capture ability and reduced noise.

Figure 15:
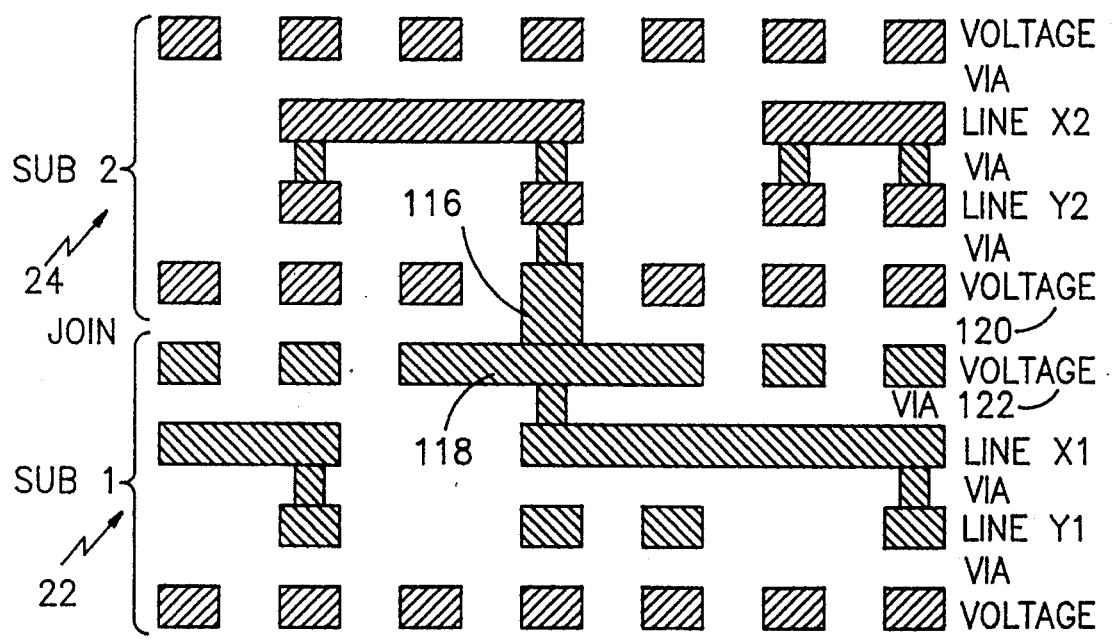
FIG. 15 shows a cross-sectional view of two plane-pairs being joined with part of the interconnection pads being included in the voltage plane of the top substrate.

Due to the large joining pads necessary to obtain complete capture of all joints, other parallel build methodologies are precluded due to the substantially adverse affect on the electrical properties on the structure. One alternative is to include the joining pads in the voltage plane, as shown in FIG. 15, and extend the metallurgy a short distance above or below the plane to avoid shorting to the plane. This substantially reduces the processing steps, but (i) results in excessively large "holes" in the voltage plane increasing the inductance of the signal lines (which increases the propagation delay according to t=square root of (LC) and (ii) couples noise into the signal lines traversing directly above the joining pads in proportion to C.

By the use of the line on line joining geometry, such a structure, such as shown in FIG. 15 can be fabricated acceptable electrical properties.

A further refinement is to incorporate the joining lines into the ground plane structure as shown in FIG. 15, thereby providing a very thick joining geometry. If there is an opening in the ground planes to account for a 60 µm capture pad, which is extended to the joining plane, approximately 12.5 µm above. The area of the opening in the ground plane required by the proposed line geometry is significantly smaller than for a 60 µm via/joining pad. The limit to the utility of this embedded plane geometry will be the relationship of the length of the line (governed by the distortion capabilities required) to the via density to be joined. The proposed line geometry, embedded in the ground plane also results in a significantly smaller number of process steps as the joining lines can be manufactured onto the ground plane structures (or vise versa). Using this strategy, both the top and bottom ground planes can be fabricated using the same processing steps. The capacitance is reduced and both the power and signal lines are joined in the same manner, as now there is sufficient line cross-section to handle the high current levels expected for the power vias (15 µm wide and 12 µm thick—6 µm within the ground plane and 6 µm above the ground plane). This can be seen in FIG. 15 which shows joining line structures 115 and 118 orthogonal to each other and extending below and above the voltage planes 120 and 122 in substrates 22 and 24 respectively.

In the above discussion, only the joining of two completed plane pairs was considered. As the cross-sectional area of this joining structure is substantially reduced compared with a pad on pad geometry the joining of more parallel structures can be accomplished, although this is limited by the ground rules for the vias relative to the length of the lines necessary to provide a suitable level of joining yield (which is related to the size of the substrate to be joined and the distortion/ misalignment to be captured). In this case, the joining would be accomplished between the two signal levels, which have ground planes closely associated with them to maintain the desired controlled impedance. The joining lines are at the mid-point within the plane pair. Since the size of the joining structure is significantly reduced, this geometry allows for a much greater via density than allowed by previous approaches, making this a candidate for higher density structures. This approach allows half plane pairs to be joined in an efficient manner, significantly reducing build times, without unduly limiting the electrical performance of the structure.

If the ground rules are relaxed, it becomes possible to consider the elimination of one of the ground planes, with the joining structure now between one ground plane and the signal plane. The disadvantage of this joining hierarchy is that the lines of the signal plane must be well aligned to the lines in the mesh ground plane, or the shielding provided by the ground plane is diminished. If continuous ground planes were utilized, rather than the mesh planes, the feasibility of removing one ground plane from the structure is enhanced, while providing no additional electrical penalty and significantly reducing the number of processing steps involved. If solid ground planes were utilized, this joining geometry provides a further parallelism in the manufacturing process—i.e. the lines and ground planes can be built separately and joined—provided that the dimensional stability of the dielectric between the signal and ground plane is maintained during processing—this is simpler when the ground rules are relaxed.

In summary, parasitic capacitance between contact pads on component substrates of a multilevel dielectric metal structure is reduced by using contact pads which are elongated and nonparallel so that there is an adequate joining probability for acceptable electrical contact.

What is claimed is:

1. A structure comprising:

a first substrate having a first side;

a second substrate having a second side;

a plurality of first electrical conductors arranged in a first array on said first side;

a plurality of second electrical conductors arranged in a second array on said second side;

said first electrical conductors having an elongated shape in a first direction;

said second electrical conductors having an elongated shape in a second direction;

said first side being disposed facing said second side with each of said first conductors in electrical contact in an overlapping region with a corresponding one of said second electrical conductor and aligned so that said first direction is nonparallel with respect to said second direction.

2. A structure according to claim 1, wherein said elongated shape is selected from the group consisting of a polygonal shape, an elliptical shape an oval shape and a mesh shape.

3. A structure according to claim 1, wherein said elongated shape is an annular shape.

4. A structure according to claim 2, wherein said polygonal shape is a rectangle.

5. A structure according to claim 3, wherein said annular shape is selected from the group consisting of an elipsodal annular shape and a polygonal annular shape.

6. A structure according to claim 5, wherein said elipsoidal annular shape is a circular annular shape.

7. A structure according to claim 5, wherein said polygonal annular shape is rectangular annular shape.

8. A structure according to claim 6, wherein said rectangular annular shape is a square annular shape.

9. A structure according to claim 2, wherein said mesh shape is selected from the group consisting of a polygonal mesh shape and a circular mesh shape.

10. A structure according to claim 1, wherein said first and said second substrates are dielectric substrates containing a plurality of electrical conductors in electrical communication with said first plurality of electrical conductors and said second plurality of electrical conductors.

11. A structure according to claim 10 further including an electronic device in electrical communication with said structure.

12. A structure according to claim 11, wherein there are a plurality of said electronic devices.

13. A structure according to claim 11, wherein said electronic devices are integrated circuit chips.

14. A structure according to claim 1, wherein said structure is electrically mounted onto an electrical substrate.

15. A structure according to claim 4, wherein said electrical substrate is selected from the group consisting of a ceramic substrate, a glass ceramic substrate, a polymer substrate, a glass substrate, a printed circuit board, a semiconductor substrate and a metal carrier substrate.

16. A structure according to claim 10, wherein said electrical substrate is selected from a group consisting of a ceramic substrate, a glass ceramic substrate, a polymer substrate, a glass substrate, a printed circuit board, a semiconductor substrate and a metal carrier substrate.

17. A structure according to claim 11, wherein said electrical substrate is selected from the group consisting of a thick film substrate and a thin film substrate.

18. A structure according to claim 2, wherein said electrical substrate is selected from the group consisting of a thick film substrate and a thin film substrate.

19. A structure according to claim 14, further including an electronic device electrically mounted onto said structure.

20. A structure according to claim 1, wherein each of said first directions for each of said first electrical conductors is not parallel to a line from a central location on said first substrate and said overlapping region and wherein each of said second direction for each of said second electrical conductors is not parallel to said line.

21. A structure according to claim 10, wherein each of said first directions for each of said first electrical conductors is not parallel to a line from a central location on said first substrate and said overlapping region and wherein each of said second directions for each of said second electrical conductors is not parallel to said line.

22. A structure comprising:

a substrate comprising a plurality of subassemblies;

each of said subassemblies comprises a dielectric body having a first and second substantially planar surface which are substantially opposite and parallel, said dielectric body contains embedded therein a plurality of electrical conductors, said electrical conductors being in electrical communication with a plurality of contact conductors on said first substantially planar surface, said contact conductors being elongated;

said first surface of one of said subassemblies being disposed facing said first surface of another of said subassemblies with at least one of said plurality of elongated contact conductors on said first surface of said one of said subassemblies being in electrical contact with one of said plurality of elongated contact conductors on said first surface of said another of said subassemblies to form a pair of nonparallel contacts in electrical communication.

23. A structure according to claim 22, wherein each of said elongated contact conductors is not parallel to a line between a central location on said substrate and an overlapping region of intersection of said nonparallel contacts in electrical communication.

24. A structure comprising:
   a first substrate having a first side;
   a second substrate having a second side;
   a first electrical conductor on said first side;
   a second electrical conductor on said second side;
   said first electrical conductor having an elongated shape in a first direction;
   said second electrical conductor having an elongated shape in a second direction;
   said first side being disposed facing said second side with said first conductor disposed in contact in an overlapping region with said second electrical conductor and aligned so that said first direction is non-parallel with respect to said second direction.

* * * * *